(12) United States Patent
Jerg et al.

(10) Patent No.: US 8,014,151 B2
(45) Date of Patent: Sep. 6, 2011

(54) ELECTRICAL DEVICE, PARTICULARLY FOR DRIVING A MOTIVELY AND/OR REGENERATIVELY OPERABLE ELECTRIC MACHINE

(75) Inventors: Juergen Jerg, Ofterdingen (DE); Erich Ilic, Unterhausen (DE); Wolfram Kienle, Magstadt (DE); Dietmar Saur, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/083,443

(22) PCT Filed: Oct. 16, 2006

(86) PCT No.: PCT/EP2006/067422
§ 371 (c)(1),
(2), (4) Date: Mar. 17, 2009

(87) PCT Pub. No.: WO2007/042576
PCT Pub. Date: Apr. 19, 2007

(65) Prior Publication Data
US 2009/0201649 A1 Aug. 13, 2009

(30) Foreign Application Priority Data
Oct. 14, 2005 (DE) .......................... 10 2005 050 028

(51) Int. Cl.
*H05K 7/20* (2006.01)

(52) U.S. Cl. ....... 361/707; 361/704; 361/709; 165/80.3; 165/104.33

(58) Field of Classification Search .................. None
See application file for complete search history.

(56) References Cited

U.S. PATENT DOCUMENTS
3,688,159 A * 8/1972 Robbins ...................... 361/717
5,305,185 A * 4/1994 Samarov et al. ............. 361/704
(Continued)

FOREIGN PATENT DOCUMENTS
DE 44 43 498 2/1996
(Continued)

OTHER PUBLICATIONS

Correvon M et al: "Power modules with IMS substrates for automotive applications" VTC Spring 2002, IEEE 55th. Vehicular Technology Conference Proceedings. Birmingham, AL. May 6-9, 2002, IEEE Vehicular Technology Conference, New York, NY: IEEE, US, Bd. vol. 1 of 4. Conf. 55, May 6, 2002, Seiten 2056-2062.

*Primary Examiner* — Boris L Chervinsky
(74) *Attorney, Agent, or Firm* — Kenyon & Kenyon LLP

(57) ABSTRACT

An electrical device, particularly for driving a motively and/or regeneratively operable electric machine, having at least one switching-element module, which may be for inverting and/or rectifying electric currents, the switching-element module being able to be cooled by a cooling device and resting at least indirectly thereon, a fixation element, at least one conductor, as well as the switching-element module and cooling device being disposed one above the other.

23 Claims, 4 Drawing Sheets

U.S. PATENT DOCUMENTS

| | | | |
|---|---|---|---|
| 5,563,447 A | 10/1996 | Lake et al. | |
| 6,091,604 A * | 7/2000 | Plougsgaard et al. | 361/707 |
| 6,107,711 A * | 8/2000 | Borchert | 310/68 D |
| 6,215,185 B1 * | 4/2001 | Kikuchi et al. | 257/747 |
| 6,272,015 B1 * | 8/2001 | Mangtani | 361/707 |
| 6,297,549 B1 * | 10/2001 | Hiyoshi | 257/703 |
| 6,522,528 B2 * | 2/2003 | Yamane | 361/601 |
| 6,621,701 B2 * | 9/2003 | Tamba et al. | 361/699 |
| 6,724,627 B2 * | 4/2004 | Onizuka et al. | 361/704 |
| 7,019,395 B2 * | 3/2006 | Hirano et al. | 257/717 |
| 7,102,896 B2 * | 9/2006 | Ajioka et al. | 361/816 |
| 2004/0062005 A1 | 4/2004 | Pfeifer et al. | |
| 2005/0128706 A1 * | 6/2005 | Maly et al. | 361/699 |

FOREIGN PATENT DOCUMENTS

| | | |
|---|---|---|
| DE | 196 45 636 | 3/1998 |
| DE | 103 06 227 | 9/2004 |
| EP | 0 597 144 | 5/1994 |
| FR | 2 855 652 | 12/2004 |
| JP | 2000-164780 | 6/2000 |
| JP | 2003-101277 | 4/2003 |
| JP | 2004-289076 | 10/2004 |
| JP | 2005-261027 | 9/2005 |
| WO | 2004/008618 | 1/2004 |
| WO | 2004/057746 | 7/2004 |

* cited by examiner (A-A)

(B-B)

ELECTRICAL DEVICE, PARTICULARLY FOR DRIVING A MOTIVELY AND/OR REGENERATIVELY OPERABLE ELECTRIC MACHINE

FIELD OF THE INVENTION

The present invention relates to an electrical device for driving a motively and/or regeneratively operable electric machine.

BACKGROUND INFORMATION

The U.S. Patent 2004/0062005 A1 discusses a power converter which is used to drive electric industrial motors. This device has circuit modules which are disposed on a heat sink. In addition to the circuit modules, electrical conductors are also provided. In this design, it is disadvantageous that the electrical conductors take up a relatively great amount of space.

SUMMARY OF THE INVENTION

The electrical device of the exemplary embodiments and/or exemplary methods of the present invention, particularly for driving a motively and/or regeneratively operable electric machine, having at least one switching-element module which may be provided for inverting and/or rectifying electric voltages, and the switching-element module being able to be cooled by a cooling device on which it at least indirectly rests, is advantageously characterized in that a fixation element, at least one conductor as well as the switching-element module and the cooling device are disposed one above the other. Advantageously, the area used in one plane can thereby turn out to be considerably less, and therefore the space requirements can be better utilized, quite especially in a motor vehicle in which there is relatively little space available as it is.

The measures delineated in the dependent claims permit advantageous further developments of the electrical device according to the main claim. If the at least one conductor is secured on the fixation element by an attaching element, then a module made up of the fixation element and conductor may already be preassembled prior to final assembly, and therefore time may be saved during final assembly. This will be all the more so, the more conductors there are to be secured on the fixation element.

If the at least one conductor is electrically isolated from the fixation element by at least one insulating intermediate layer, it is then possible, for example, to connect the fixation element to the electrical ground, regardless of the potential state of the conductor. If insulating intermediate layers between the individual conductors are formed at least sectionally in such a way that they project beyond the conductors, then it is possible to greatly increase a "creeping-current spacing" via these intermediate layers. Short circuits or power-diminishing creeping currents are thereby avoided.

A good relative-position allocation between the insulating intermediate layer and/or a conductor with respect to the fixation element results if the position is determined by a centering arrangement.

It is advantageously provided that the fixation element is produced from the same material as the housing, that is, the cooling device of the electrical device. The result is that thermal stresses between a composite construction of the fixation element, conductor, switching-element module and cooling device are largely avoided, since the fixation element, as well as the material of the housing expand with the same coefficient of thermal expansion.

To avoid edge pressures and other unacceptably high pressures between the fixation element and the switching-element module, an elastic module is provided between the fixation element and the switching-element module.

The switching-element module has both conductors which conduct high currents, as well as conductors which conduct low currents. These high-current conductors heat up more than the other "signal conductors." It is therefore envisaged to spatially separate the high-current conductors from the signal conductors, and thus to provide that power conductors (high-current conductors) project from one side, and signal conductors project from one side. A suitable design is yielded if the sides lie opposite each other. In addition, the ends of the power conductors point away from the cooling device. This has the advantage that a junction between the conductors on the switching-element module and the power conductors is particularly conveniently accessible. Moreover, the ends of the signal conductors point away from the cooling device. For example, it is thereby possible to also mount a printed circuit board over the assemblage of switching-element module, fixation element, conductor and cooling device already mentioned. This printed circuit board may then be joined to the signal conductors by simple placement in the direction of the components just mentioned.

According to a further refinement of the exemplary embodiments and/or exemplary methods of the present invention, a group of signal conductors which project from one side of the switching-element module includes one conductor that permits a voltage supply to regions of a printed circuit board, which is necessary for driving the signal conductors.

According to another development of the exemplary embodiments and/or exemplary methods of the present invention, a shielding element covers the at least one conductor, and thus, for example, a printed circuit board situated above it is shielded from electromagnetic influences. In this context, it is provided to dispose the shielding element between the at least one conductor and a circuit substrate.

According to another refinement of the exemplary embodiments and/or exemplary methods of the present invention, a relative position of the switching-element module with respect to the cooling device is defined by positive-locking elements.

The drawing shows exemplary embodiments of the electrical device according to the exemplary embodiments and/or exemplary methods of the present invention.

DETAILED DESCRIPTION

Figure 1:
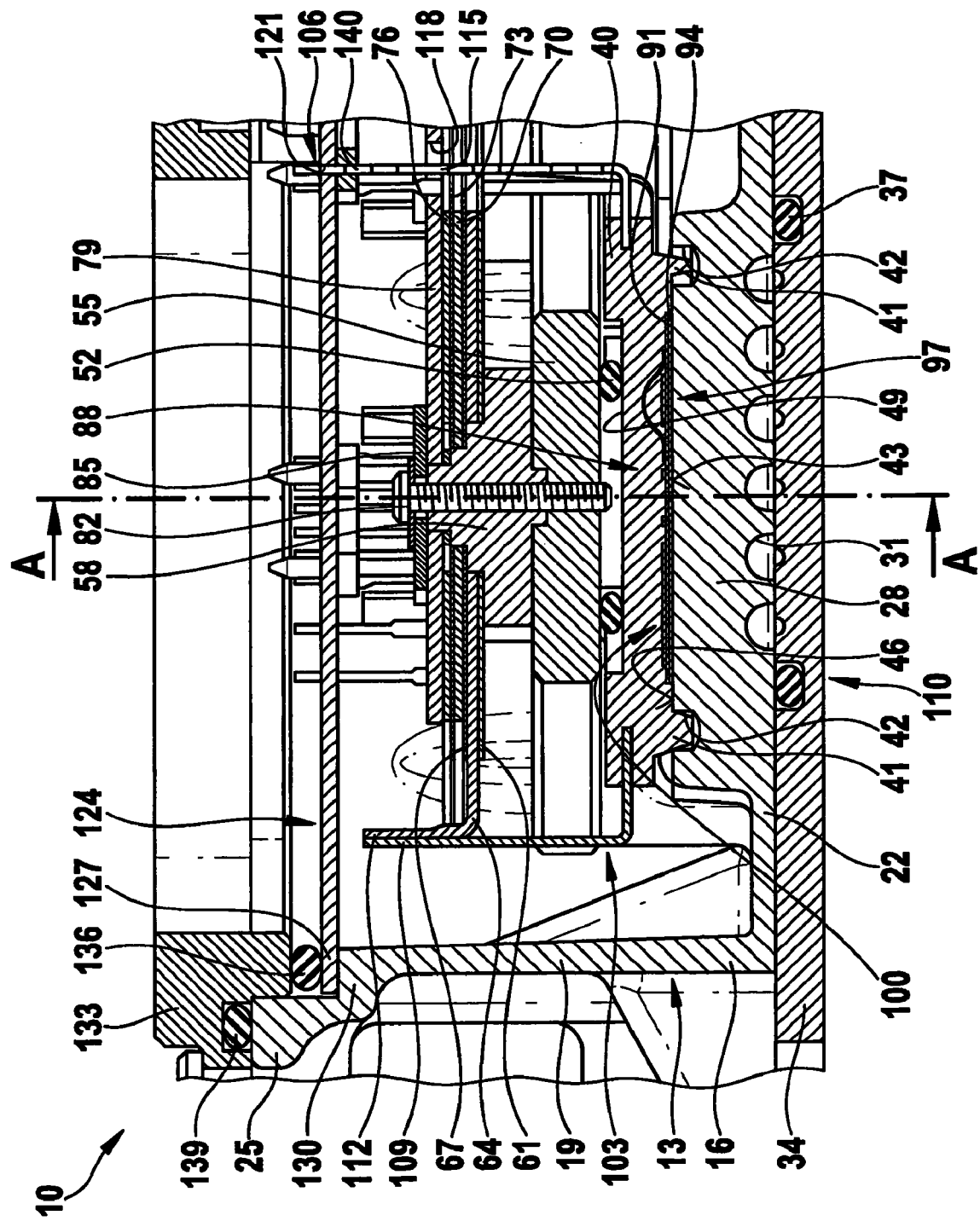
FIG. 1 shows a partial section through a first exemplary embodiment.

FIG. 1 shows a partial cross-section through an electrical device 10, which is used here for driving a motively and/or regeneratively operable electric machine (not shown). This electrical device 10 is made up of a housing 13, which is structured from a plurality of components. Housing 13 is made of a cup-shaped housing part 16, in which various electrical and electronic components are disposed, which will be discussed later. Cup-shaped housing part 16 has a housing wall 19 which ends in a housing edge 25 facing away from a housing bottom 22. Housing bottom 22 has a housing section, denoted here as platform 28, whose material thickness is somewhat greater. On its side facing away from the bottom floor of housing 13, this platform 28 has a plurality of cooling channels 31 that are closed by a closing cover 34. Cooling channels 31 are closed on the whole in fluid-tight manner by a seal 37. Initially, a switching-element module 40 sits on this platform 28 and in housing 13.

The relative position between switching-element module 40 and platform 28, i.e., housing bottom 22 is produced here in this exemplary embodiment by positive-locking elements. In this exemplary embodiment, pins 41 secured on switching-element module 40 extend into holes 42 in housing bottom 22, that is, platform 28.

In this context, a flat surface 43 of switching-element module 40 rests on an equally flat surface 46 of platform 28. An elastic element 52 which, e.g., may be in the form of elastomer or a round loop or something similar, is inserted in a recess 49 in switching-element module 40. Switching-element module 40 and elastic element 52 are disposed or braced between platform 28 or housing bottom 22 and a fixation element 55, as will be explained in greater detail in the specification. Fixation element 55 is essentially bar-shaped here, and extends lengthwise over platform 28 which is elongated as well. Fixation element 55 has the task of pressing switching-element module 40 onto platform 28, and thus to improve the heat transfer between platform 28 and switching-element module 40.

An insulator 58 rests on fixation element 55. On this ring-shaped insulator 58, which is stepped like a pyramid in the direction pointing away from switching-element module 40, a first step bears an insulating intermediate layer 61, on which a conductor 64 is supported. Lying on this conductor 64, and also on the side facing away from switching-element module 40, is a further insulating intermediate layer 67, on which in turn a further conductor 70 is resting. Lying on this conductor 70 is in turn a further insulating intermediate layer 73, and a further conductor 76 rests on insulating intermediate layer 73. A shielding element 79 rests on conductor 76. Thus, insulator 58 acts as a centering arrangement and determines the position of the conductors and intermediate layers.

Individual conductors 64, 70 and 76 and insulating intermediate layers or interlayers 61, 67 and 73, as well as shielding element 79 and insulator 58 are pressed onto fixation element 55 by an attaching element 82, here in the form of a screw, with the aid of a washer 85.

Switching-element module 40 is essentially block-like or cuboidal, and has an electronic circuit 88 in its interior.

For example, this electronic circuit 88 rests on a ceramic mounting board 91, which in turn has a heat-conducting plate 94 on its back side. For example, this heat-conducting plate 94 is a plate made of copper, which is supported against platform 28. To improve the heat transfer between heat-conducting plate 94 and platform 28, for instance, a heat-conducting paste 97 may also be provided between switching-element module 40 and platform 28. Situated on ceramic mounting board 91 are at least two switchable half-bridges 100, which are represented only symbolically here in FIG. 1. These half-bridges 100 are used to alter a provided direct current in such a way that an alternating current or three-phase current is produced in a power conductor 103. Half-bridges 100 are controlled by signal conductors 106 electrically connected to them. At the transition point of switching-element module 40 at its outer side, power conductor 103 is initially oriented parallel to surface 46 of platform 28, to then change its direction after a few millimeters outside of switching-element module 40, so that an end 109 of power conductor 103 points away from the cooling device or housing bottom 22. At end 109, it overlaps with an equally bent end 112 of conductor 64 and forms an interconnect point here to this conductor 64, which represents a phase connection for the electric machine. Projecting from another side of switching-element module 40 are signal conductors 106 already mentioned, which just like the power conductors or power conductor 103, initially extend straight and in parallel to surface 46 of platform 28, to then deviate after a bend pointing away from housing bottom 22. Signal conductor 106 thus has two legs, the first leg projecting out of switching element module 40, and the second leg, after a bend, pointing away from housing bottom 22. This second leg 115 extends through an opening 118 in shielding element 79, to finally protrude through connecting holes 121 of a circuit substrate 124, i.e., a printed circuit board 124. At these connecting holes 121, an electrical connection is ultimately implemented between signal conductors 106 and an electrical circuit (not shown here) disposed on circuit substrate 124.

Circuit substrate 124 is supported with an outer edge 127 on a shoulder 130 of housing wall 19. An elastic element 136 is situated between edge 127 and a housing cover 133. A further seal 139 seals off the interior of housing 13 from the outer surroundings.

Thus, FIG. 1 shows an electrical device 10 that is used in particular to drive a motively and/or regeneratively operable electric machine. This electrical device 10 has at least one switching-element module 40 which may be used for inverting and/or rectifying electric voltages. In this case, switching-element module 40 is able to be cooled by a cooling device 110. Switching-element module 40 rests at least indirectly on this cooling device 110. To rest on at least indirectly means here that switching-element module 40 rests on platform 28, i.e., housing bottom 22 with, e.g., a layer of heat-conducting paste 97 in between. A direct mounting would be provided, for example, by omitting a heat-conducting paste 97. A fixation element 55, at least one conductor 64, as well as switching-element module 40 and cooling device 110 are disposed one above the other. At the same time, it is provided that the at least one conductor 64 is secured to fixation element 55 by an attaching element 82. In motive operation, the at least one conductor 64 is used for the power supply of a phase connection of an electric machine. In regenerative operation, through actuation of electronic circuit 88, a (pulsing) direct current is produced by the phase connection or conductor 64, by which current is supplied to a (high-current) battery or accumulator through lines (not shown here). The at least one conductor 64—or perhaps the other conductors 70 and 76—are electrically isolated from fixation element 55 by at least one insulating intermediate layer 61 or 67 and 73. Thus, as already indicated, further conductors 70 and 76, respectively, rest on the at least one conductor 64 and are electrically isolated from each other by insulating intermediate layers 67 and 73.

As FIG. 1 also shows, insulating intermediate layers 61, 67 and 73 project somewhat, and here at least sectionally, beyond conductors 70 and 76.

Due to attaching element 82, a pressure force is in effect between the at least one conductor 64 and fixation element 55. Fixation element 55 is intended to be of the same material as housing 13 or housing bottom 22, which has cooling device 110 and represents a base of switching-element module 40. Elastic element 52 is disposed between fixation element 55 and switching-element module 40. Elastic element 52 is produced from a flexible synthetic material, which may be an elastomer.

As FIG. 1 shows, conductors project out of switching-element module 40 from several sides. In so doing, power conductors 103 protrude from one side, and signal conductors 106 protrude from another side of switching-element module 40. Power conductors 103 and signal conductors 106 point away with their ends 109 and 140, respectively, from cooling device 110. Alternatively, conductor 64 could also be bent downward, for instance, with its upper end in FIG. 1, and meet in the level between switching-element module 40 and housing bottom 22, and ultimately be interconnected there. In this case, power conductor 103 would not point away with its end 109 from cooling device 110.

Figure 2:
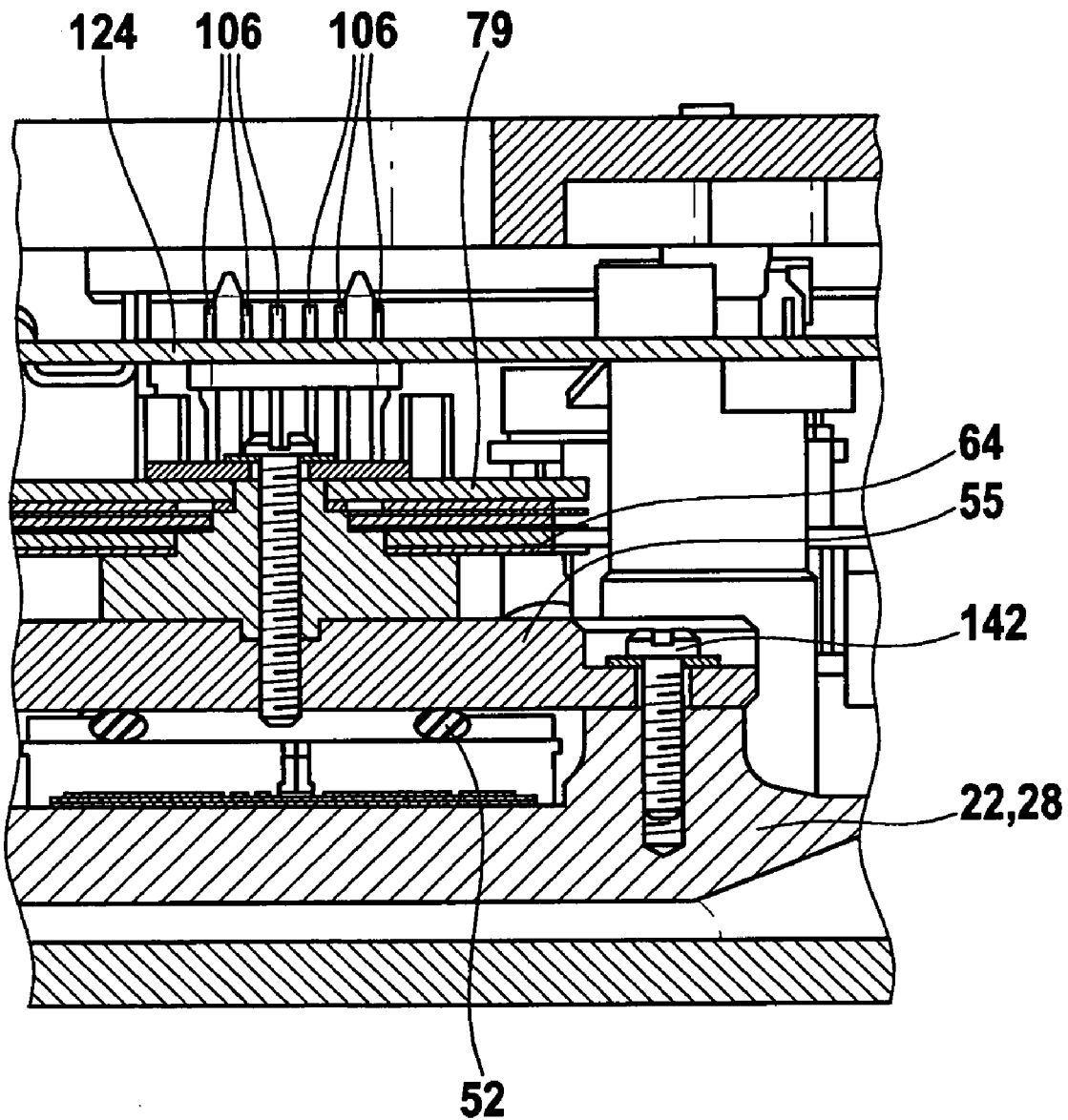
FIG. 2 shows a second cross-section through the first exemplary embodiment from FIG. 1 according to line A-A.

As already mentioned, FIG. 2 shows a view that is transverse to the view according to FIG. 1. While in FIG. 1, only one signal conductor 106 is discernible in a side view, in FIG. 2, six signal conductors 106 are discernible, one conductor which permits a voltage supply of circuit substrate 124 belonging to this group of signal conductors 106. Shielding element 79 covers the at least one conductor 64; this does not mean that shielding element 79 completely covers this conductor, but rather, shielding element 79 at least partially covers at least one conductor 64, 70, 76. As discernible in FIG. 1 and FIG. 2, shielding element 79 is situated between the at least one conductor 64 and circuit substrate 124. As recognizable in FIG. 2, fixation element 55 is fixedly joined to housing bottom 22, that is, platform 28 by an attaching element 142 in the form of a screw. Fixation element 55 presses here on switching-element module 40 with the aid of elastic element 52.

Figure 3:
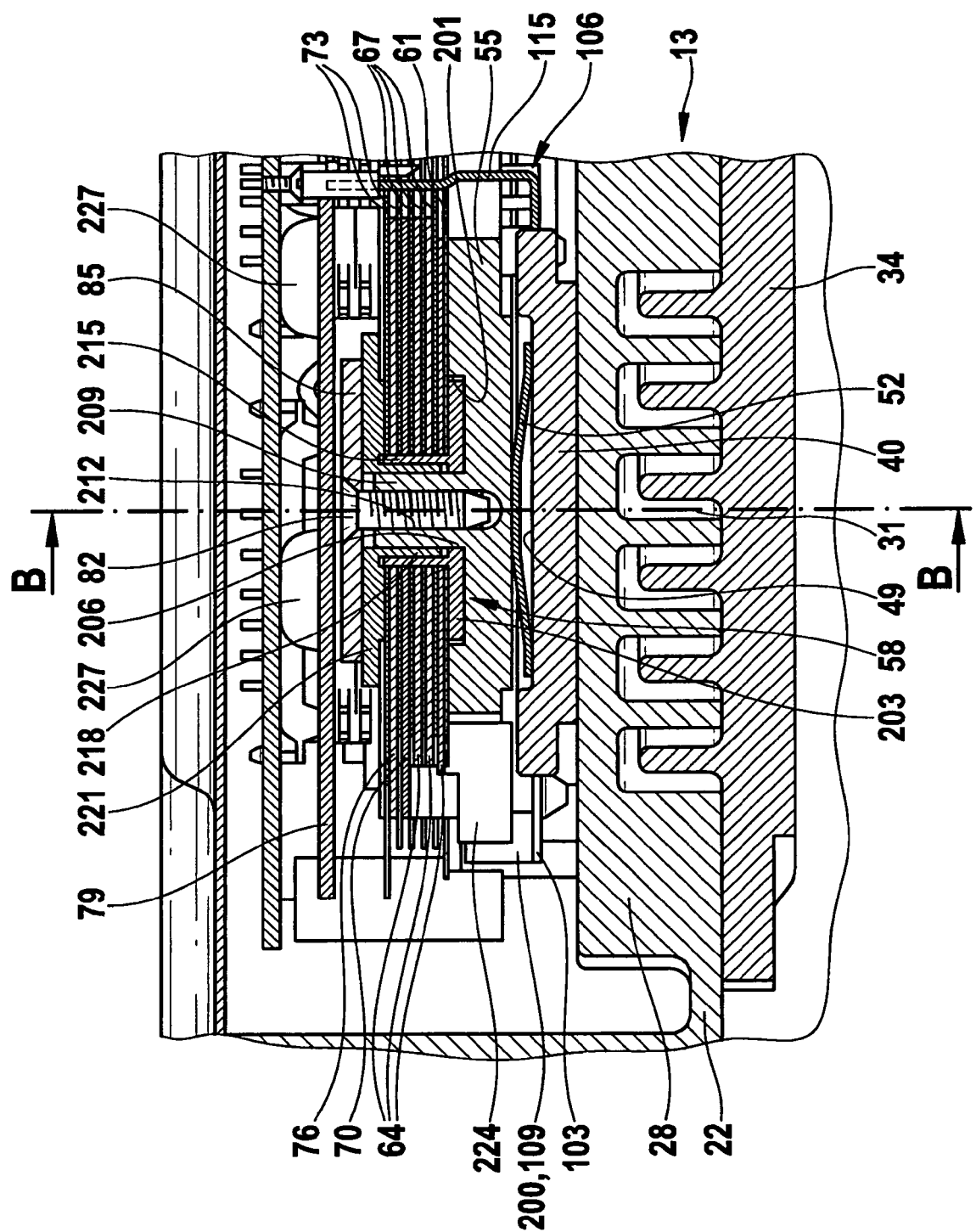
FIG. 3 shows a cross-section of a second exemplary embodiment.
Figure 4:
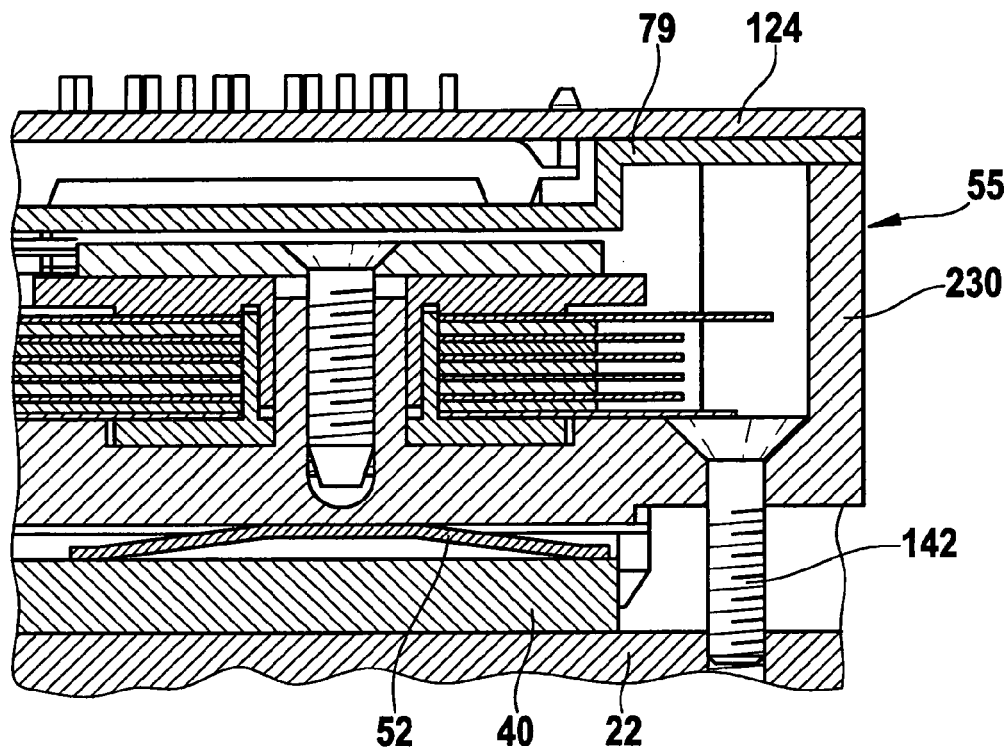
FIG. 4 shows a cross-section through the second exemplary embodiment according to line B-B.

A second exemplary embodiment is shown in FIG. 3 and FIG. 4. The description of FIG. 3 now goes into detail concerning the essential differences with respect to FIG. 1 and FIG. 2, respectively. It should be noted here that identical reference numerals denote objects having the same function as in the first exemplary embodiment. Switching-element module 40 is again resting on a platform 28. On the right side of switching-element module 40, signal conductors 106 protrude with their second legs 115, which ultimately contact circuit substrate 124. Power conductors 103 are in turn lamina-like (or sheet-like), end 109 in this case being a bent lamina tab 200.

Although an elastic element 52 is again situated in recess 49 of switching-element module 40 as a force-transmission element between fixation element 55 and switching-element module 40, this elastic element 52 is now represented by a metallic pressure spring which, for example, functions as or is a leaf spring. Fixation element 55 in turn has a recess 201, in which insulator 58 is located. Insulator 58 has an annular plate 203, which has a central opening 206 in its center. This central opening 206 encompasses an annular-cylindrical stud 209 which is formed in one piece from fixation element 55. Stud 209 therefore has a bore-like opening 212 which is provided with an internal screw thread, so that attaching element 82 in the form of a screw is able to engage with it.

Going out from plate 203 is a circular ring-shaped connecting piece 215, which surrounds stud 209. A further connecting piece 218, which originates from a plate 221, engages between stud 209 and connecting piece 215. Both connecting pieces 215 and 218 are aligned relatively to each other prior to assembly. Situated between the two plates 203 and 221 are a plurality of conductors 64, which in each instance are assigned to different phases of the electric machine, not shown here. In the example, these would be three conductors 64 for three different phases of a three-phase machine. For example, if this machine were five-phase or even six-phase, five or six conductors 64 would be disposed here. Moreover, also disposed on these conductors 64 are a conductor 70 and a conductor 76, which in each case have the task of either supplying switching-element module 40 with direct voltage, or of transmitting (pulsating) direct voltage, generated by switching-element module 40, to a battery or an accumulator likewise not shown here. In accustomed manner, insulating intermediate layers 61, 67 and 73 are situated between conductors 64, 70 and 76, so that short circuits are avoided. Bent lamina tabs 224 go out from a conductor 64 here, as well, and are positioned directly adjacent to lamina tabs 200. Lamina tabs 200 and 224, respectively, are constantly electrically connected to each other, and represent the electrical connection with respect to switching-element module 40 and phase connection of the electric machine. Shielding element 79 covers the at least one conductor 64 or conductors 64 here, as well. This is not inevitably to be understood as a complete covering here, either. In this example, shielding element 79 has a plurality of bulges 227 which serve as bearing surface for circuit substrate 124, and on which it is screwed in place. Circuit substrate 124 is decoupled from the stack formation in the vertical direction. Signal conductors 106 have a springy quality in order to compensate for the tolerances and different thermal expansions.

In this design, the heat sink assumes the function of the central reference.

FIG. 4 shows a sectional view through switching-element module 40 in FIG. 3, this view now being transverse)(90° to the view in FIG. 3. As already in the exemplary embodiment according to FIG. 1 and FIG. 2, fixation element 55 is secured to housing bottom 22 by an attaching element 142 here, as well. Elastic element 52, in the form of the leaf spring already mentioned, is easily discernible here. Fixation element 55 here has a collaring edge 230 which projects beyond switching-element module 40, and on which shielding element 79 rests with one edge. Moreover, circuit substrate 124 comes to rest on shielding element 79. As already in the previous exemplary embodiment, insulating intermediate layers 61, 67 and 73, respectively, project beyond conductors 64 or 70 and 76.

Figure 5:
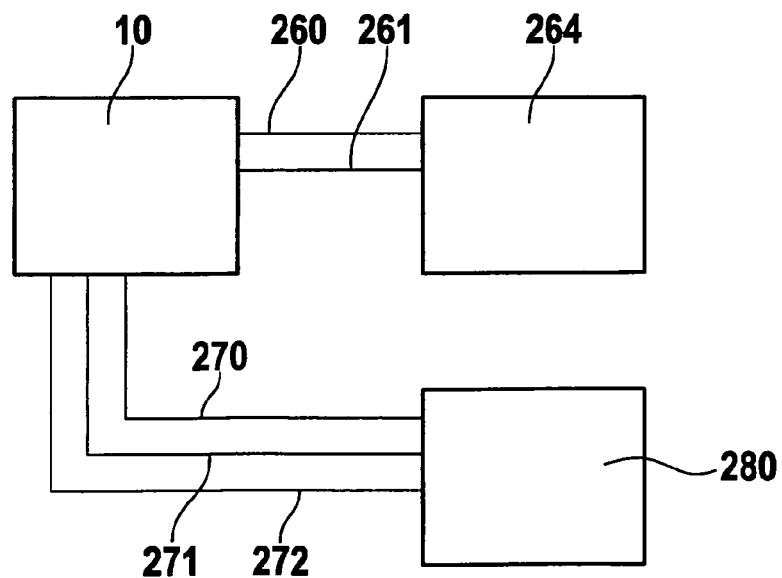
FIG. 5 shows a basic representation of a system made up of power supply, electrical device according to the present invention, and electric machine.

Shown schematically in FIG. 5 is electrical device 10, which is connected by two conductors 260 and 261 to an electric energy store such as a battery or an accumulator 264. Device 10 is connected to electric machine 280 by three phase conductors 270, 271 and 272. If electric machine 280 were not a three-phase, but rather a four-phase or five-phase machine, for example, then four or five phase connections would represent a connection between device 10 and electric machine 280.

Of course, the positive-locking elements may also be arranged the other way around, so that pins 41 are located on platform 28, i.e., housing bottom 22, while holes 42 are configured on switching-element module 40. The stacking of conductors 64 or 70 and 76 one upon the other in the first exemplary embodiment, or of conductors 64 or 70 and 76 in the second exemplary embodiment is sometimes also called "BUS-BAR technology." Conductors 64 are also known as phase lamina, since they are lamina-like and are assigned to the electrical phases of electric machine 280. Conductors 70 and 76, respectively, are also known as "traction lamina", since they are lamina-like and are the conductors which transmit the drive current (traction current) from battery 264 to electric machine 280. Shielding element 79 is implemented as a lamina, for instance, which represents the EMV shielding, and at the same time is used as support for the printed circuit board, i.e., circuit substrate 124. In the exemplary embodiment according to FIG. 1 and FIG. 2, circuit substrate 124 is screwed onto shielding element 79. However, other fixation possibilities such as clamping or adhesive bonding are conceivable here, as well.

According to a further exemplary embodiment not drawn and described here in greater detail, switching-element module 40 could also be screwed directly onto the heat sink, that is, platform 28 or housing bottom 22, and thus be positioned as well. Suitable features of switching-element module 40, thus, for example, spigots (alignment pins) could be used here as positioning. The centering could also be accomplished via a screw motion (screw connection) or a similar arrangement of attachment. Fixation element 55 could then be centered over switching-element module 40 or over housing bottom 22, i.e., platform 28. Elastic spring element 52 would then no longer be necessary.

While in the three aforementioned exemplary embodiments, fixation element 55 is always disposed between switching-element module 40 and the "BUS-BAR", i.e., conductors 64 or 70 and 76, fixation element 55 could also be disposed above the aforesaid conductors, so that conductors 64, 70 and 76 would be situated between fixation element 55 and switching-element module 40. For example, elastic element 52 here could be formed of a spring-steel plate, which would form the lowest layer of the BUS-BAR. When fixing the BUS-BAR onto housing bottom 22 or platform 28, switching-element module 40 would be pressed onto platform 28 or housing bottom 22. If switching-element module 40 were screwed or fastened by a similarly acting arrangement onto the heat sink or housing bottom 22, that is, platform 28, the press-on operation would no longer be necessary, and the spring element or elastic element 52 could be omitted like in exemplary embodiment 3, as well.

What is claimed is:

1. An electrical device to drive at least one of a motively operable electric machine and a regeneratively operable electric machine, comprising:
    at least one switching-element module, the switching-element module being able to be cooled by a cooling device, and resting at least indirectly thereon;
    an assembly module, which includes a fixation element for pressing the switching-element module against the cooling device, and at least one conductor fastened to the fixation element by a fastening element, wherein the assembly module, the switching-element module and the cooling device are disposed one above the other, wherein the at least one switching-element module performs at least one of inversion and rectification of an electric current, wherein at least one conductor is electrically separated by at least one insulating intermediate layer, and wherein the fixation element is connectable to the electrical ground.

2. The electrical device of claim 1, wherein the at least one conductor is used for a power supply of a phase connection of the electric machine.

3. The electrical device of claim 1, wherein the at least one conductor is electrically isolated from the fixation element by at least one insulating intermediate layer.

4. The electrical device of claim 3, wherein resting on the at least one conductor are further conductors which are electrically isolated from each other by insulating intermediate layers.

5. The electrical device of claim 3, wherein the insulating intermediate layers project at least sectionally beyond the conductors.

6. The electrical device of claim 3, wherein a position of at least one of (i) at least one insulating intermediate layer and (ii) at least one conductor with respect to the fixation element is determined by a centering element.

7. The electrical device of claim 1, wherein the fixation element is made of a same material as a base of the switching-element module.

8. The electrical device of claim 1, wherein an elastic element is disposed between the fixation element and the switching-element module.

9. The electrical device of claim 1, wherein conductors project from several sides of the switching-element module, power conductors project from one side, and signal conductors project from another side.

10. The electrical device of claim 9, wherein at least one of the power conductors and the signal conductors point away with their ends from the cooling device.

11. The electrical device of claim 9, wherein the group of signal conductors includes one conductor which permits a voltage supply to the circuit substrate.

12. The electrical device of claim 1, wherein a shielding element at least partially covers at least one conductor.

13. The electrical device of claim 12, wherein the shielding element is disposed between the at least one conductor and a circuit substrate.

14. The electrical device of claim 1, wherein a relative position of the switching-element module with respect to the cooling device is defined by positive-locking elements.

15. The electrical device of claim 1, wherein the fixation element is connected to an electrical ground regardless of a potential state of the at least one conductor.

16. The electrical device of claim 1, further comprising:
    pins secured on the switching element module that extend into holes in a housing bottom.

17. The electrical device of claim 1, wherein the switching element has an electronic circuit in its interior.

18. The electrical device of claim 1, further comprising:
    at least two switchable half-bridges that alter a provided direct current so that an alternating current or three-phase current is produced in the at least one conductor.

19. The electrical device of claim 1, further comprising:
    a platform having a plurality of cooling channels.

20. The electrical device of claim 1, further comprising:
    pins secured on the switching element module that extend into holes in a housing bottom;
    at least two switchable half-bridges that alter a provided direct current so that an alternating current or three-phase current is produced in the at least one conductor;
    wherein the fixation element is connected to an electrical ground regardless of a potential state of the at least one conductor, and
    wherein the switching element has an electronic circuit in its interior.

21. The electrical device of claim 20, further comprising:
    a platform having a plurality of cooling channels.

22. The electrical device of claim 1, wherein the centering element is an insulator.

23. The electrical device of claim 1, wherein the fixation element, using the centering element, is electrically separated from the at least one phase conductor.

* * * * *